(12) United States Patent
Chung et al.

(10) Patent No.: US 8,110,922 B2
(45) Date of Patent: Feb. 7, 2012

(54) WAFER LEVEL SEMICONDUCTOR MODULE AND METHOD FOR MANUFACTURING THE SAME

(75) Inventors: Hyun-Soo Chung, Hwaseong-si (KR); Seung-Duk Baek, Yongin-si (KR); Dong-Ho Lee, Seongnam-si (KR); Dong-Hyeon Jang, Suwon-si (KR); Seong-Deok Hwang, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 153 days.

(21) Appl. No.: 12/588,231

(22) Filed: Oct. 8, 2009

(65) Prior Publication Data

US 2010/0032807 A1 Feb. 11, 2010

Related U.S. Application Data

(62) Division of application No. 11/585,088, filed on Oct. 24, 2006, now abandoned.

(30) Foreign Application Priority Data

Apr. 21, 2006 (KR) .................. 10-2006-0036312

(51) Int. Cl.
*H01L 23/48* (2006.01)
(52) U.S. Cl. .................. 257/734; 257/737; 257/E23.021
(58) Field of Classification Search ............ 438/461, 438/462, 465; 257/620
See application file for complete search history.

(56) References Cited

U.S. PATENT DOCUMENTS

| | | | |
|---|---|---|---|
| 4,179,794 A * | 12/1979 | Kosugi et al. | 438/465 |
| 6,153,448 A | 11/2000 | Takahashi et al. | |
| 6,348,728 B1 | 2/2002 | Aiba et al. | |
| 2002/0094602 A1 * | 7/2002 | Her et al. | 438/106 |
| 2006/0019467 A1 | 1/2006 | Lee et al. | |

FOREIGN PATENT DOCUMENTS

| | | |
|---|---|---|
| JP | 11-111896 | 4/1999 |
| JP | 2000-243729 | 9/2000 |

OTHER PUBLICATIONS

Yuh-Min Johnson Chiang, A Wafer-Level Microcap Array to Enable High-Yield Microsystem Packaging, Aug. 2004, IEEE Transaction on advanced packaging, vol. 27, No. 3.

* cited by examiner

*Primary Examiner* — Marcos D. Plzarro
*Assistant Examiner* — Eva Yan Montalvo
(74) *Attorney, Agent, or Firm* — Harness, Dickey & Pierce, P.L.C.

(57) ABSTRACT

A wafer level semiconductor module may include a module board and an IC chip set mounted on the module board. The IC chip set may include a plurality of IC chips having scribe lines areas between the adjacent IC chips. Each IC chip may have a semiconductor substrate having an active surface with a plurality of chip pads and a back surface. A passivation layer may be provided on the active surface of the semiconductor substrate of each IC chip and may having openings through which the chip pads may be exposed. Sealing portions may be formed in scribe line areas.

15 Claims, 11 Drawing Sheets

FIG. 1

(CONVENTIONAL ART)

FIG. 2

(CONVENTIONAL ART)

WAFER LEVEL SEMICONDUCTOR MODULE AND METHOD FOR MANUFACTURING THE SAME

PRIORITY STATEMENT

This is a Divisional of application Ser. No. 11/585,088, filed Oct. 24, 2006 now abandoned, which claims benefit of priority under 35 U.S.C. §119 from Korean Patent Application No. 2006-36312, filed on Apr. 21, 2006 in the Korean Intellectual Property Office (KIPO), the entire contents of which are incorporated herein by reference.

BACKGROUND

1. Field

Example, non-limiting embodiments relate generally to a semiconductor module and a method for manufacturing the semiconductor module, for example, to a wafer level semiconductor module implementing an integrated circuit (IC) chip set and a method for manufacturing the wafer level semiconductor module.

2. Description of the Related Art

The electronic industry seeks methods, techniques and designs that provide electronic products which may be smaller, lighter, faster, more efficient, provide multiple functions and/or result in improved performance, at an effective cost. One such development has been in the area of semiconductor packaging techniques, such as chip scale packages (CSP's), wafer level packages, or wafer level chip scale packages (WLCSP's), for example. Another such development has been in the area of board fabrication techniques, for example embedded printed circuit boards (PCB's) that may include passive devices, for example capacitors or inductors. However, it is rare to develop techniques for mounting semiconductor packages at the module level.

Figure 1:
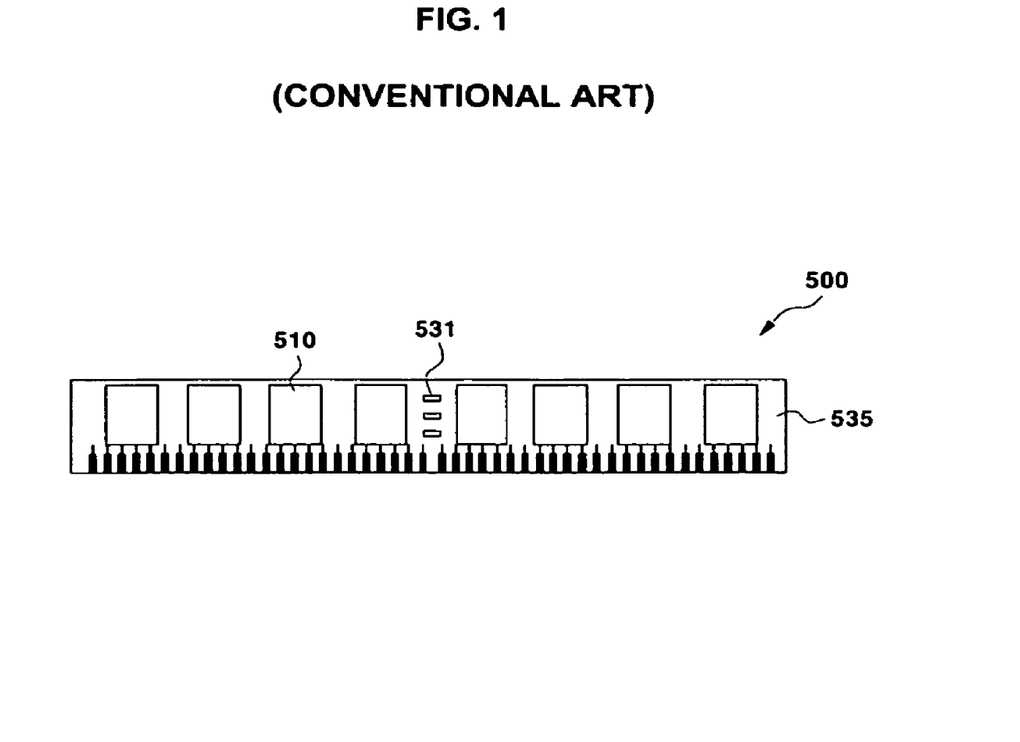
FIG. 1 is a plan view of a conventional semiconductor module.
Figure 2:
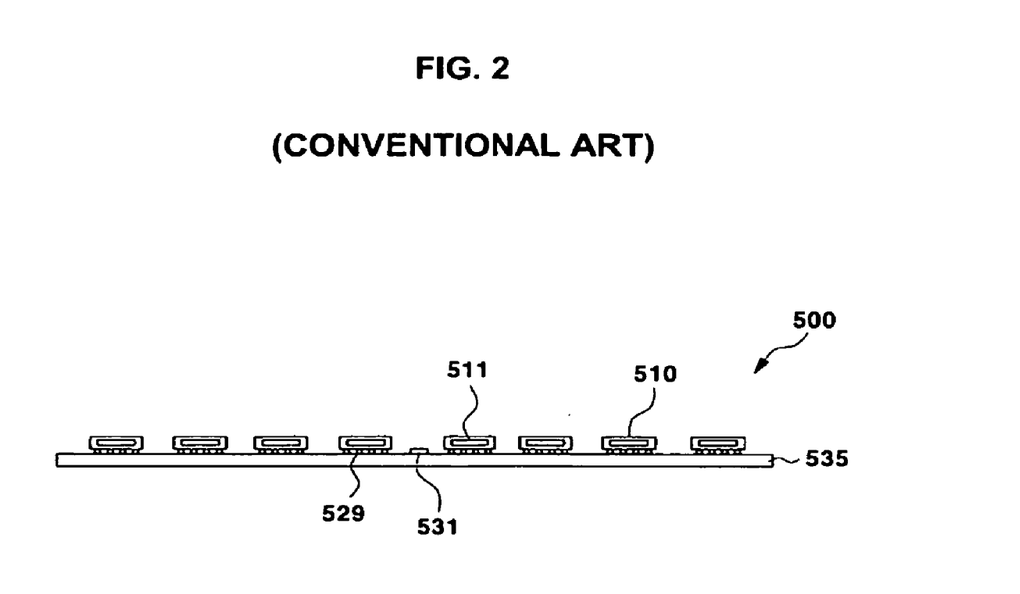
FIG. 2 is a cross-sectional view of the conventional semiconductor module in FIG. 1.

FIG. 1 is a plan view of a conventional semiconductor module 500. FIG. 2 is a cross-sectional view of the conventional semiconductor module 500.

Referring to FIGS. 1 and 2, the semiconductor module 500 may include a module board 535, and semiconductor packages 510 and passive devices 531 that are mounted on the module board 535 using solder balls 529. The semiconductor package 510 may be implemented for interconnections by a wire bonding method, a TAB bonding method or a flip chip bonding method. The semiconductor package 510 may have a semiconductor chip 511 that may be formed of various structures.

The conventional semiconductor module 500 may implement the semiconductor package 510 that may be completed through a series of processes including a wafer fabrication process, an electric die sorting test process and a package assembly process. Thereby, the semiconductor module 500 may be manufactured by a complicated, time-consuming and cost-ineffective process. Further, there may be limitations in reducing the size of the semiconductor module 500.

SUMMARY

Example, non-limiting embodiments may provide a wafer level semiconductor module that may reduce the size of an electronic module, and a method for manufacturing the wafer level semiconductor module.

In an example embodiment, a wafer level semiconductor module may include a module board. An IC chip set may be mounted on the module board. The IC chip set may include a plurality of IC chips having scribe line areas between the adjacent IC chips. Each IC chip may have a semiconductor substrate having an active surface with a plurality of chip pads and a back surface. Sealing portions may be provided in the scribe line areas.

According to an example embodiment, the sealing portions may have a width substantially equal to a width of the corresponding scribe line areas.

According to an example embodiment, each IC chip may have an interlayer dielectric layer provided on the semiconductor substrate, a redistribution layer may be provided on the interlayer dielectric layer, and an insulating layer may be provided on the redistribution layer.

According to an example embodiment, the sealing portions may be formed integrally with the interlayer dielectric layer or the insulating layer.

According to an example embodiment, the sealing portions may be formed in a multilayered structure.

According to an example embodiment, the sealing portions may be formed from polymer composition. The polymer composition may include low-temperature-cure polymer.

According to an example embodiment, the sealing portions may be formed from elastomer composition.

According to an example embodiment, the module may further include external connection terminals provided on the redistribution layer and may be configured to connect the IC chip set to the module board. The external connection terminals may be arranged at uniform intervals.

According to an example embodiment, the back surface of each IC chip may have a protection layer. The protection layer may be an adhesive tape.

According to an example embodiment, the IC chip set may include a plurality of IC chips that may be provided in a matrix arrangement.

In an example embodiment, a method for manufacturing a wafer level semiconductor module may involve providing a wafer. The wafer may have an IC chip set having a plurality of IC chips and scribe line areas between the adjacent IC chips. Each adjacent IC chip may have a semiconductor substrate having an active surface with a plurality of chip pads and a back surface. A passivation layer may be provided on the active surface of the semiconductor substrate leaving the chip pads exposed. Trenches may be provided in the scribe line areas. Sealing portions may be provided in the trenches. The wafer may be separated into individual IC chip sets. The IC chip set may be mounted on the module board.

According to an example embodiment, an interlayer dielectric layer may be provided on the passivation layer and a redistribution layer, the redistribution layer may be connected to the chip pads. An insulating layer may be provided on the redistribution layer and the interlayer dielectric layer to expose a portion of the redistribution layer.

According to an example embodiment, the trenches may have a width substantially equal to a width of the corresponding scribe line areas.

According to an example embodiment, the sealing portions may be formed integrally with the interlayer dielectric layer or the insulating layer. The sealing portions may be formed in a multilayered structure.

According to an example embodiment, the wafer may be separated into IC chips having a matrix arrangement.

According to an example embodiment, the sealing portions may be formed by providing polymer in the trenches. The polymer provided in the trenches may be a low-temperature-cure polymer.

According to an example embodiment, the sealing portions may be formed by providing elastomer in the trenches.

According to an example embodiment, the redistribution layer may be a multilayered redistribution layer that may be formed using the interlayer dielectric layer.

According to an example embodiment, a portion of the back surface of the semiconductor substrate may be removed to expose a portion of the sealing portions. A protection layer may be attached to the wafer where the back surface was removed. The protection layer may be an adhesive tape.

According to an example embodiment, external connection terminals may be provided on the exposed portion of the redistribution layer. The external connection terminals may be arranged over the IC chip set at uniform intervals.

BRIEF DESCRIPTION OF THE DRAWINGS

Example embodiments will be readily understood with reference to the following detailed description thereof in conjunction with the accompanying drawings, wherein like reference numerals designate like structural elements.

The drawings are for illustrative purposes only and are not drawn to scale. The spatial relationships and/or relative sizing of the elements illustrated in the various embodiments may have been reduced, expanded or rearranged to improve the clarity of the figures with respect to the corresponding description. The figures, therefore, should not be interpreted as accurately reflecting the relative sizing and/or positioning of the corresponding structural elements that could be encompassed by an actual device manufactured according to the example embodiments.

DESCRIPTION OF EXAMPLE NON-LIMITING EMBODIMENTS

Example, non-limiting embodiments will now be described more fully hereinafter with reference to the accompanying drawings. This invention may, however, be embodied in many different forms and should not be construed as limited to the example embodiments set forth herein. Rather, the disclosed embodiments are provided so that this disclosure will be thorough and complete, and will fully convey the scope of the invention to those skilled in the art. The principles and features of this invention may be employed in varied and numerous embodiments without departing from the scope of the invention.

The figures are intended to illustrate the general characteristics of methods and/or devices of example embodiments of this invention, for the purpose of the description of such example embodiments herein. The drawings are not, however, to scale and may not precisely reflect the characteristics of any given embodiment, and should not be interpreted as defining or limiting the range of values or properties of example embodiments within the scope of this invention. Rather, for simplicity and clarity of illustration, the dimensions of some of the elements may be exaggerated relative to other elements.

Well-known structures and processes are not described or illustrated in detail to avoid obscuring the example embodiments.

An element is considered as being mounted (or provided) "on" another element when mounted or provided) either directly on the referenced element or mounted (or provided) on other elements overlaying the referenced element. Throughout this disclosure, spatial terms such as "upper," "lower," "above" and "below" (for example) are used for convenience in describing various elements or portions or regions of the elements as shown in the figures. These terms do not, however, require that the structure be maintained in any particular orientation.

Figure 3:
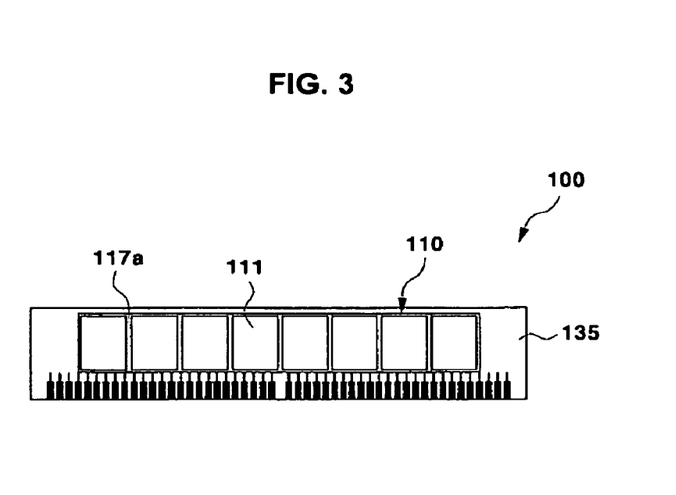
FIG. 3 is a plan view of a wafer level semiconductor module in accordance with an example, non-limiting embodiment.
Figure 4:
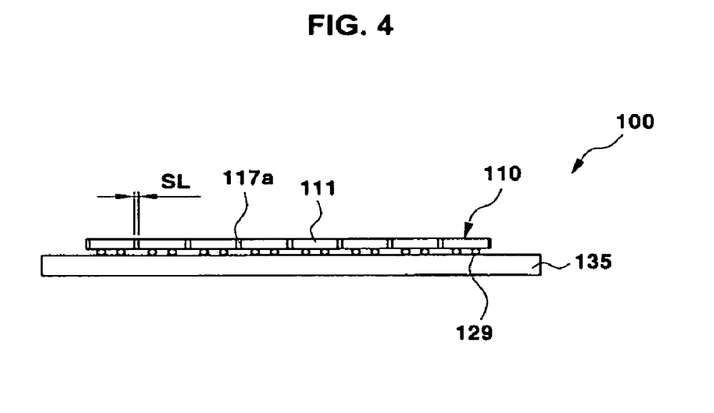
FIG. 4 is an example cross-sectional view of the wafer level semiconductor module in FIG. 3.

FIG. 3 is a plan view of a wafer level semiconductor module 100 in accordance with an example embodiment. FIG. 4 is a cross-sectional view of the wafer level semiconductor module 100 in FIG. 3.

Referring to FIGS. 3 and 4, the semiconductor module 100 may include a module board 135 and an IC chip set 110 mounted on the module board 135 by external connection terminals 129, for example conductive bumps. The IC chip set 110 may include a plurality of IC chips 111 provided in a matrix arrangement. By way of example only, eight IC chips 111 may be arranged in a row. The plurality of IC chips 111 may have scribe line areas (SL), which may also be referred to as scribe lanes or sawing lanes, between the adjacent IC chips 111. Sealing portions 117a may be provided in the scribe line areas (SL) to surround the side surfaces of the IC chips 111. The external connection terminals 129 may, for example, be formed through a rerouting process at wafer level.

In an example embodiment, the plurality of IC chips 111 that have completed a package assembly process at wafer level may be directly attached to the module board 135. The IC chip set 110 including the plurality of IC chips 111 may be separated from a wafer as a single entity. In this way, the semiconductor module 100 may be manufactured by a simplified process and the size of the semiconductor module 100 may be reduced. In comparison with a conventional semiconductor module of the same size, the semiconductor module 100 may accommodate a greater number of the IC chips and/or larger IC chips. Further, the module board 135 may have an increased flexibility of design.

The module board 135, the external connection terminals 129 and the plurality of IC chip 111 may have different coefficients of thermal expansion. The sealing portions 117a provided in the scribe line areas (SL) may absorb mechanical stresses which may result from the difference in coefficients of thermal expansion. Additionally, the sealing portions 117a may serve as an electrical shield between the plurality of IC chips 111 to reduce or prevent electrical interference between the IC chips 111. Accordingly, the sealing portions 117a may reduce the likelihood that warpage may occur in edges of the IC chip set 110.

Figure 5:
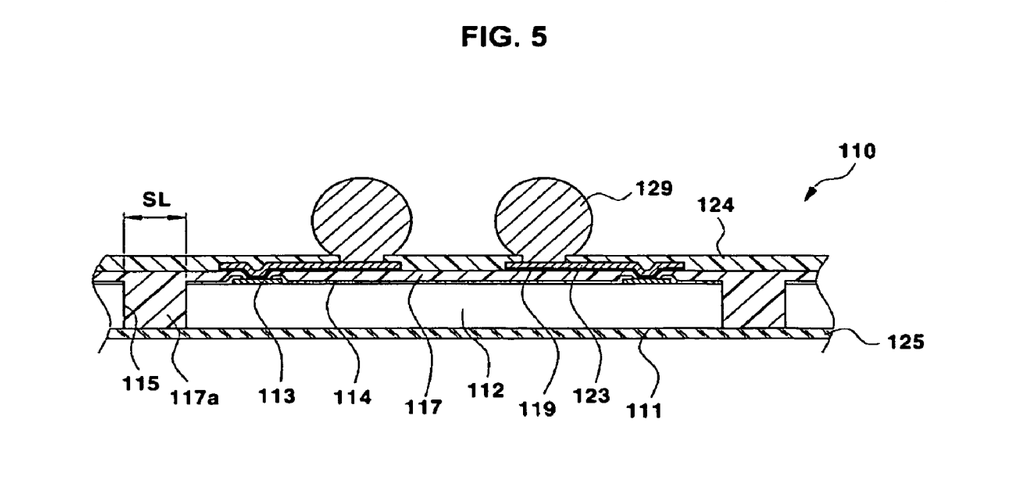
FIG. 5 is an example cross-sectional view of the structure of an IC chip set of the wafer level semiconductor module in FIG. 4.

FIG. 5 is an example cross-sectional view illustrating the structure of the IC chip set 110 of the wafer level semiconductor module 100 in FIG. 4.

Referring to FIG. 5, each of the IC chips 111 may have a semiconductor substrate 112 having an active surface with chip pads 113 and a back surface. A passivation layer 114 may be provided on the active surface of the semiconductor substrate 112, which may expose the chip pads 113. An interlayer dielectric layer 117 may be provided on the passivation layer 114. A redistribution layer 123 may be provided on the interlayer dielectric layer 117. An insulating layer 124 may be provided on the redistribution layer 123, which may expose a portion of the redistribution layer 123. The external connection terminals 129 may be provided on the exposed portion of the redistribution layer 123.

By way of example only, the sealing portions 117a may be formed from resin, for example a polymer composition. The polymer composition may include lower-temperature-cure polymer, of which the curing temperature may be 200° C. or lower, for example. The lower-temperature-cure polymer may reduce the likelihood that lower productivity may result from deterioration of the IC chips that may occur during curing of the polymer.

In an alternative example embodiment, the sealing portions 117a may be formed from elastomer composition. The sealing portions 117a may be integral with the interlayer dielectric layer 117 and may be formed from the same material as the interlayer dielectric layer 117. For example, the sealing portions 117a may be formed by providing insulating materials in trenches 115 while the interlayer dielectric layer 117 is formed.

The width of the sealing portions 117a may be substantially equal to the width of the corresponding scribe line areas (SL). The sealing portions 117a may run through the full depth of the semiconductor substrate 112. In this way, the sealing portions 117a may secure the maximum volume between the adjacent IC chips 111 to provide the maximum stress-absorbing effect. Alternatively, the sealing portions 117a may run through a portion of the semiconductor substrate 112, or the width of the sealing portions 117a may be smaller than the width of the corresponding scribe line areas (SL).

A protection layer 125, for example, adhesive tape, may be provided on the back surface of the semiconductor substrate 112 and may be configured to protect the back surface of the semiconductor substrate 112. By way of example only, the protection layer 125 may be a polyimide tape. Alternatively, the protection layer 125 may be other various elements for protecting the back surface of the semiconductor substrate 112.

FIGS. 6 to 16 are schematic views of a method for manufacturing a wafer level semiconductor module in accordance with an example embodiment.

Figure 6:
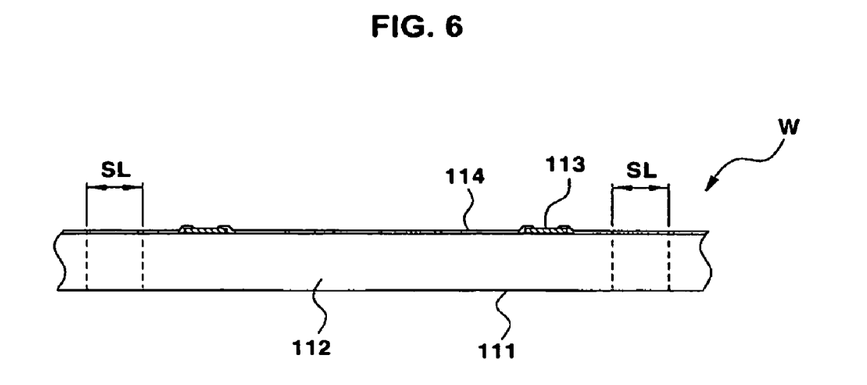
FIGS. 6 to 16 are schematic views of a method that may be implemented to manufacture a wafer level semiconductor module in accordance with an example, non-limiting embodiment.

Referring to FIG. 6, a wafer (W) may include an IC chip set having a plurality of IC chips 111. Each IC chip 111 may have a silicon semiconductor substrate 112, chip pads 113 and a passivation layer 114. By way of example only, the chip pads 113 may be formed from metals, for example aluminum. The passivation layer 114 may be formed from nitride, for example. The passivation layer 114 may be provided on the active surface of each IC chip 111 and may expose the chip pads 113. The chip pads 113 may be arranged along the opposing edges of each IC chip 111 or at the center of each IC chip 111, for example. The IC chip set may have scribe line areas (SL) between adjacent IC chips 111.

Figure 7:
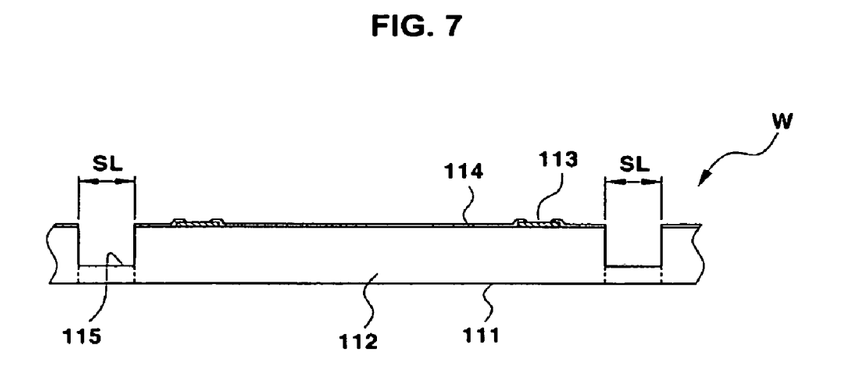

Referring to FIG. 7, trenches 115 may be formed in the scribe line areas (SL). The trenches 115 may run to a determined depth of the semiconductor substrate 112 through the passivation layer 114. By way of example only, the trenches 115 may be formed using a photolithographic process and an etching process. The width of the trenches 115 may be smaller than or equal to the width of the corresponding scribe line areas (SL). If the width of the trenches 115 is equal to the width of the corresponding scribe line areas (SL), the volume of the sealing portions 117a that may be provided in the trenches 115 may be maximized. To secure the maximum volume, the trenches 115 may extend perpendicularly to the wafer surface from the edges of the scribe line areas (SL). The shape of the trenches 115 may vary.

Figure 8:
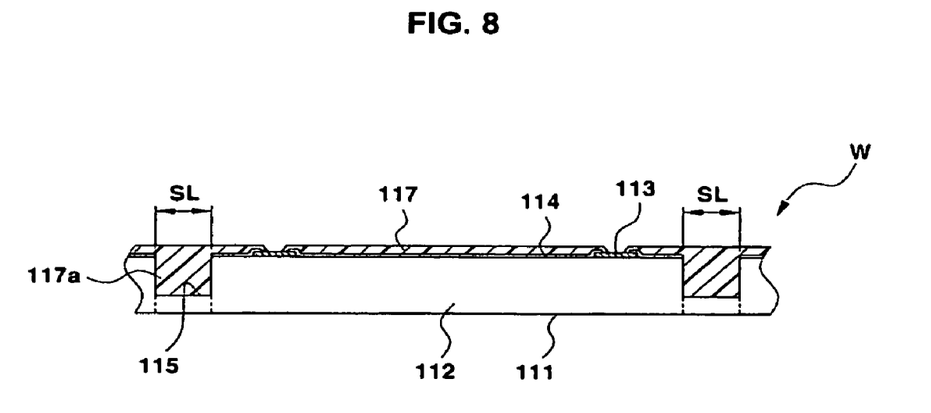

Referring to FIG. 8, the trenches 115 may be filled. An interlayer dielectric layer 117 may be provided on the passivation layer 114 that may expose the chip pads 113. While the interlayer dielectric layer 117 is being formed, the trenches 115 may be filled with materials to form sealing portions 117a. For example, the interlayer dielectric layer 117 and the sealing portions 117a may serve as thermal stress absorption and/or electrical insulation. By way of example only, the interlayer dielectric layer 117 may be formed from polymer composition, for example photosensitive polyimide (PSPI), benzo-cyclo-butene (BCB), or epoxy. For example, the interlayer dielectric layer 117 may be provided on the surface of the semiconductor substrate 112 using a spin coating method, and a portion of the interlayer dielectric layer 117 may be removed using a photo process to expose the chip pads 113.

Figure 9:
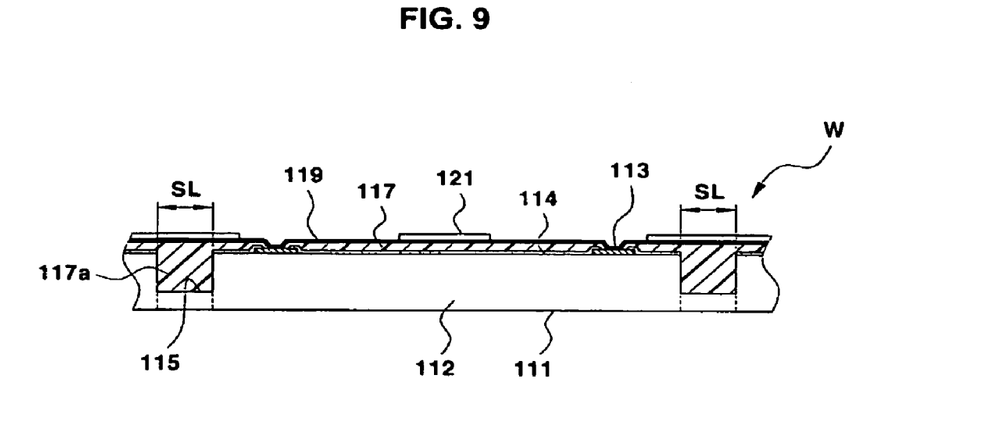

Referring to FIG. 9, a seed metal layer 119 may be provided on the interlayer dielectric layer 117 and may be connected to the chip pads 113. By way of example only, the seed metal layer 119 may be formed using a deposition method or a sputtering method. The seed metal layer 119 may be multilayered using alloy of various metals, for example, Ti/Cu, Cr/Cu, Cr/Ni, Cr/V, Ti/Cu/Ni, or Cr/Ni/Au.

A photoresist layer 121 may be provided on the seed metal layer 119. For example, the photoresist layer 121 may be formed through application, exposure and development of photoresist materials. The photoresist layer 121 may be used to expose a portion of the seed metal layer 119.

Figure 10:
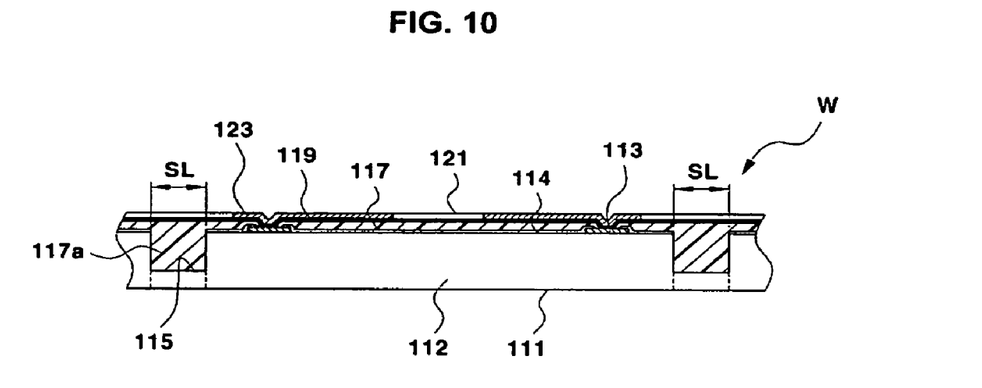

Referring to FIG. 10, a redistribution layer 123 may be provided on the exposed portion of the seed metal layer 119. The redistribution layer 123 may be formed from materials having improved electrical conductivity, for example, Cu. The redistribution layer 123 may be connected to the chip pads 113. By way of example only, the redistribution layer 123 may be formed by an electroplating process using the seed metal layer 119 as a plating electrode. The electroplating process may be replaced with an electroless process, a mechanical vapor deposition process or a chemical vapor deposition process, for example. After the redistribution layer 123 is provided, the photoresist layer 121 may be removed.

Figure 11:
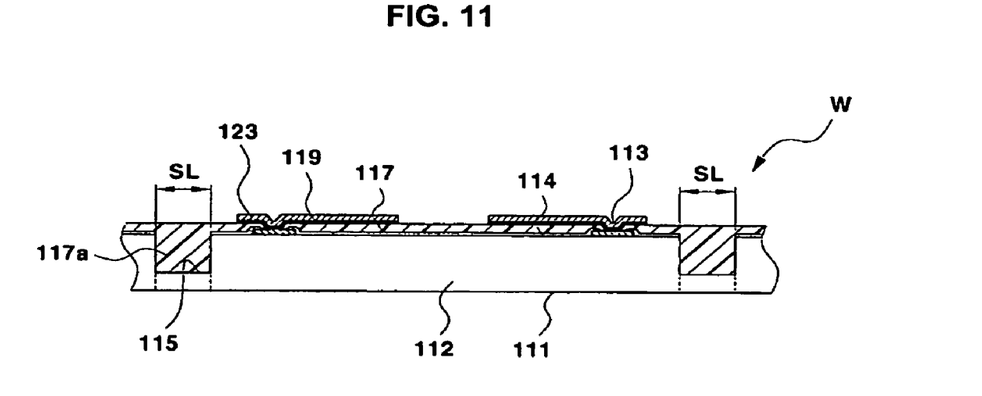

Referring to FIG. 11, the exposed portion of the seed metal layer 119 may be removed using the redistribution layer 123 as a mask. By way of example only, removal of the seed metal layer 119 may be implemented by an anisotropic etching method or an isotropic etching method.

Figure 12:
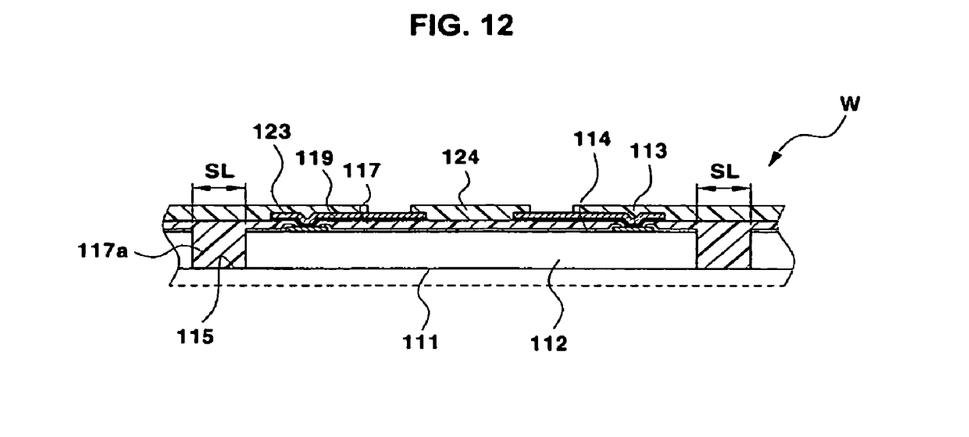

Referring to FIG. 12, an insulating layer 124 may be provided on the redistribution layer 123 and the interlayer dielectric layer 117. A portion of the insulating layer 124 may be removed so that external connection terminals may be provided on the exposed redistribution layer 123. By way of example only, the insulating layer 124 may be formed from the same material as the interlayer dielectric layer 117. The resultant wafer (W) may be backlapped to reduce the thickness. The backlapping process may expose a portion of the sealing portions 117a.

Figure 13:
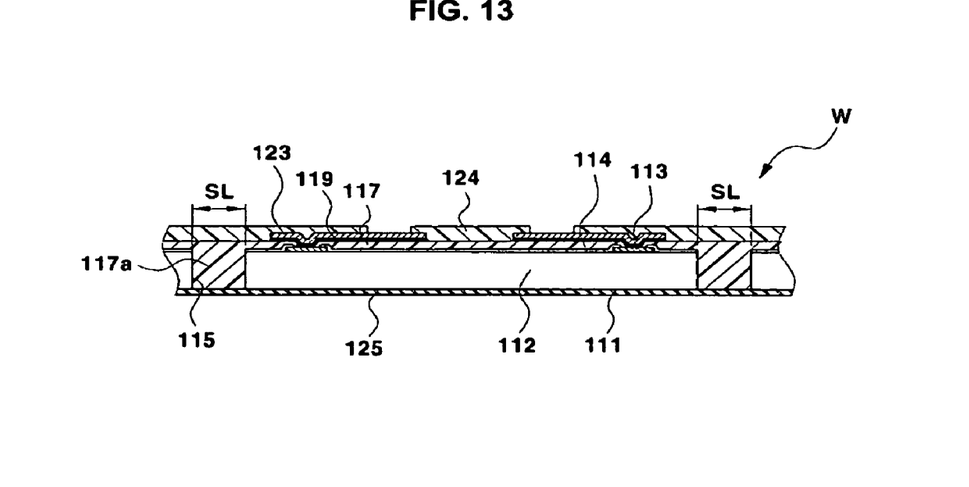

Referring to FIG. 13, a protection layer 125, for example an adhesive tape, may be attached to the back surface of the wafer (W). The protection layer 125 may protect the back surface of the IC chip 111 from the external environment. By way of example only, the protection layer 125 may be an insulating tape having adhesive property, for example a polyimide tape. Elements and/or processes for protecting the IC chip 111 may vary.

Figure 14:
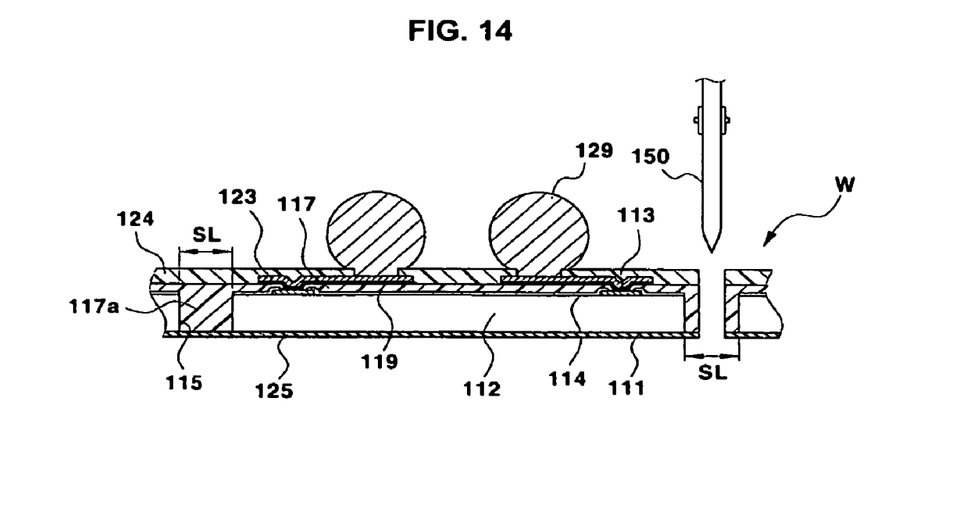

Referring to FIG. 14, external connection terminals 129 may be provided on the exposed portion of the redistribution layer 123. A multilayered under bump metallurgic (UBM) layer may be provided under the external connection terminals 129. The external connection terminals 129 may be aligned on and attached to the exposed portion of the redistribution layer 123 using a reflow process. By way of example only, the external connection terminals 129 may be conductive bumps formed from metals, for example, Cu, Au or Ni. Although the external connection terminals 129 may be formed using a plating method, formation of the external connection terminals 129 may be not limited in this regard. For example, the external connection terminals 129 may be formed using a bump placement method or a stencil printing method.

Figure 15:
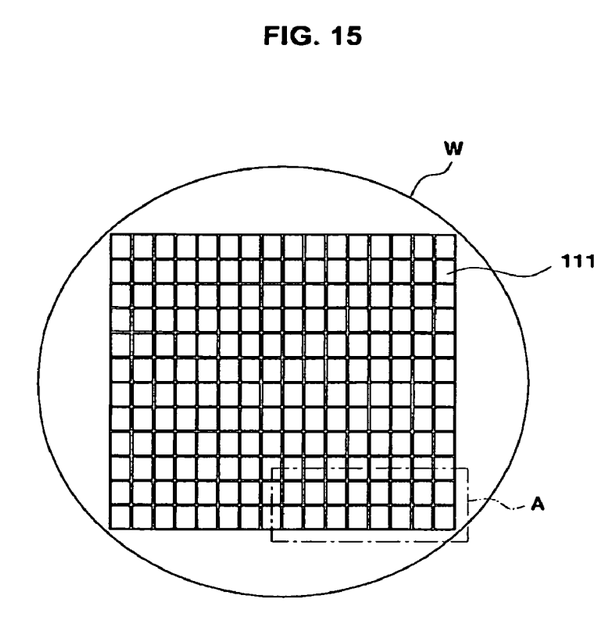
Figure 16:
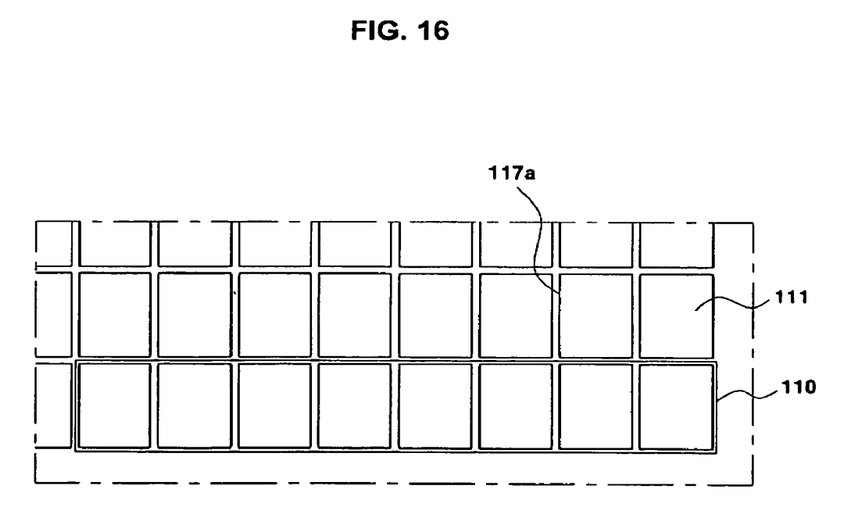

Referring to FIGS. 14-16, an IC chip set 110 may be separated from the wafer (W). The IC chip set 110 may include a plurality of the IC chips 111 provided in an m*n matrix arrangement, for example 1*8. The IC chip set 110 may be sawed along the scribe line areas (SL) using a sawing blade 150.

Returning to FIG. 4, the IC chip set 110 may be mounted on a module board 135 using the external connection terminals 129.

Figure 17:
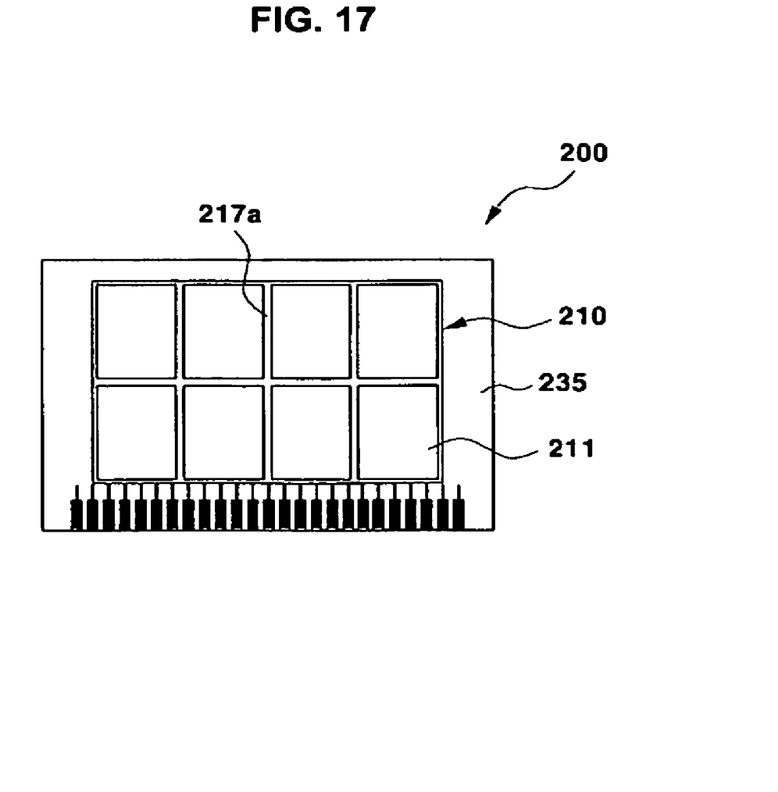
FIG. 17 is a plan view of a wafer level semiconductor module in accordance with another example, non-limiting embodiment.
Figure 18:
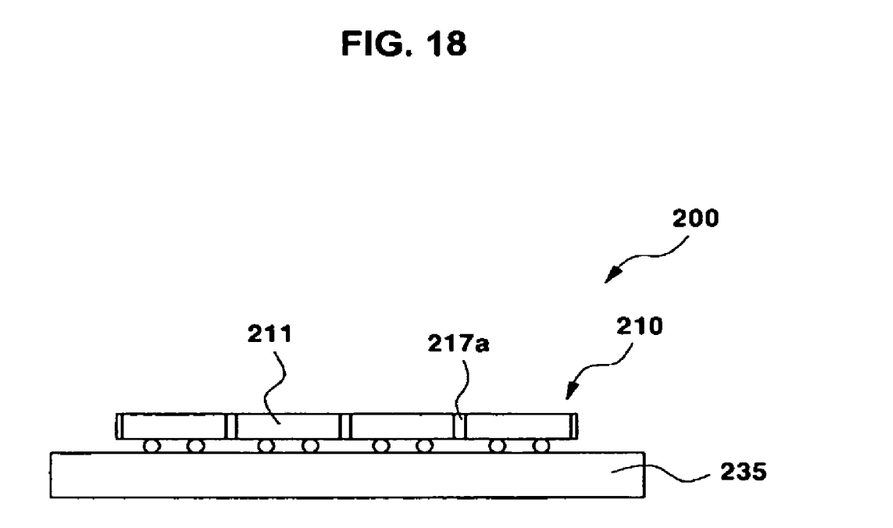
FIG. 18 is an example cross-sectional view of the wafer level semiconductor module in FIG. 17.

FIG. 17 is a plan view of a wafer level semiconductor module 200 in accordance with another example embodiment. FIG. 18 is a cross-sectional view of the wafer level semiconductor module 200 in FIG. 17.

Referring to FIGS. 17 and 18, the wafer level semiconductor module 200 may include a module board 235 and an IC chip set 210 mounted on the module board 235. For example, the IC chip set 210 may include a plurality of IC chips 211 provided in a 2*4 matrix arrangement. The two-row arrangement of the IC chips 211 may allow for reduced length of the semiconductor module 200. Sealing portions 217a may be configured to absorb thermal stresses.

Figure 19:
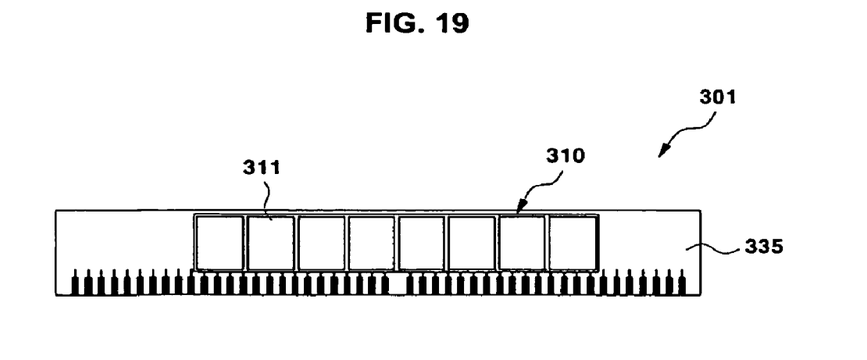
FIG. 19 is a plan view of a wafer level semiconductor module in accordance with another example, non-limiting embodiment.
Figure 20:
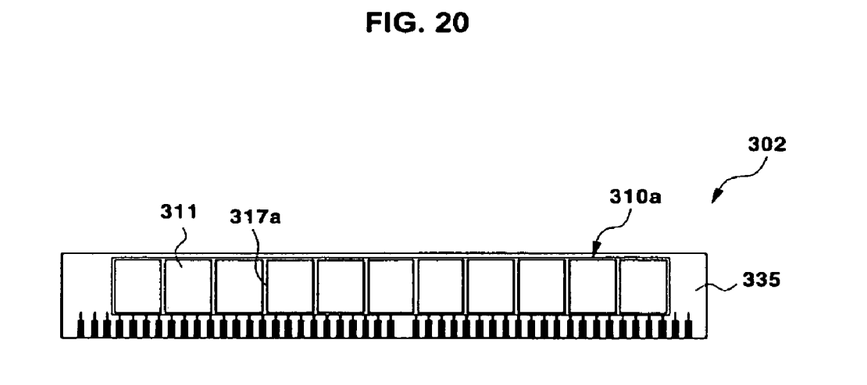
FIG. 20 is a plan view of a wafer level semiconductor module in accordance with another example, non-limiting embodiment.
Figure 21:
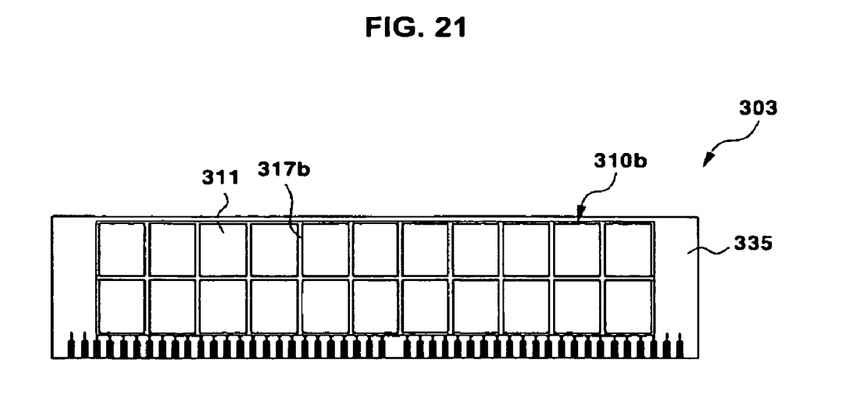
FIG. 21 is a plan view of a wafer level semiconductor module in accordance with another example, non-limiting embodiment.

FIG. 19 is a plan view of a wafer level semiconductor module 301 in accordance with another example embodiment. FIG. 20 is a plan view of a wafer level semiconductor module 302 in accordance with another example embodiment. FIG. 21 is a plan view of a wafer level semiconductor module 303 in accordance with another example embodiment.

Referring to FIG. 19, the wafer level semiconductor module 301 may include a module board 335 and an IC chip set 310 mounted on the module board 335. For example, the IC chip set 310 may include a plurality of IC chips 311 provided in a 1*8 matrix arrangement.

Referring to FIG. 20, the wafer level semiconductor module 302 may include a module board 335 and an IC chip set 310a mounted on the module board 335. For example, the IC chip set 310a may include a plurality of IC chips 311 provided in a 1*11 matrix arrangement.

Referring to FIG. 21, the wafer level semiconductor module 303 may include a module board 335 and an IC chip set 310b mounted on the module board 335. For example, the IC chip set 310b may include a plurality of IC chips 311 provided in a 2*11 matrix arrangement.

Figure 22:
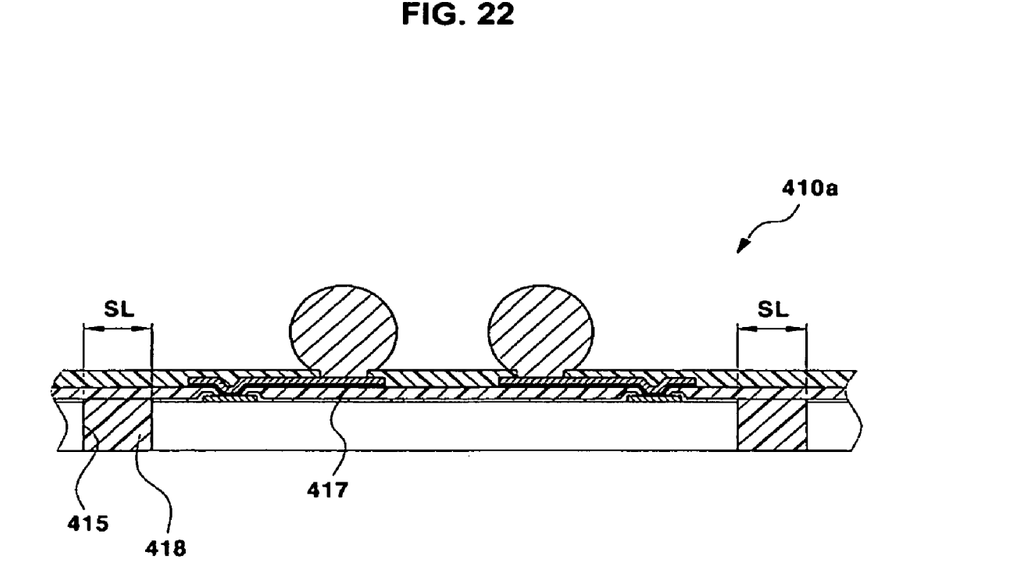
FIG. 22 is a cross-sectional view of the structure of an IC chip set of a wafer level semiconductor module in accordance with another example, non-limiting embodiment.
Figure 23:
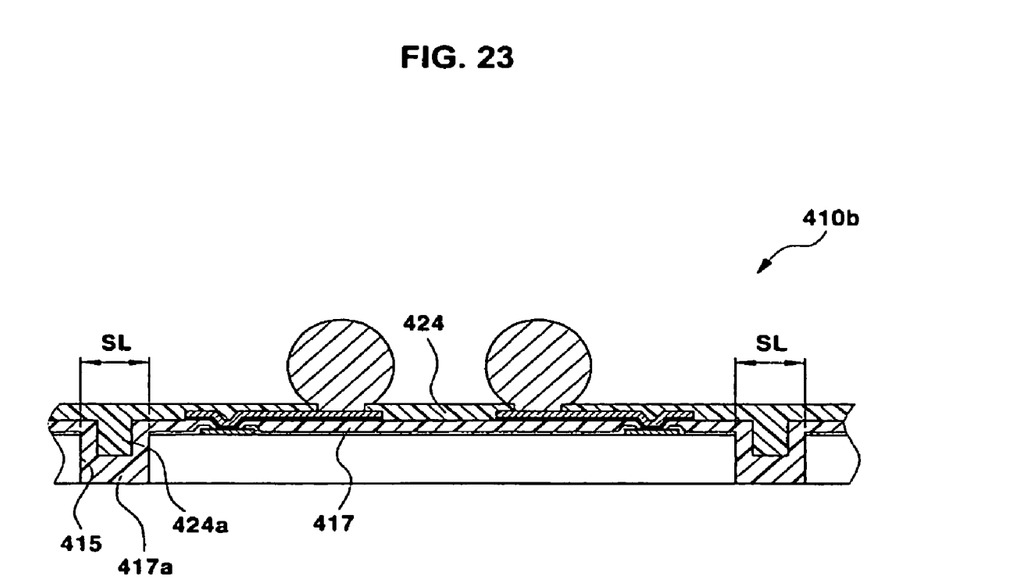
FIG. 23 is a cross-sectional view of the structure of an IC chip set of a wafer level semiconductor module in accordance with another, non-limiting example embodiment.
Figure 24:
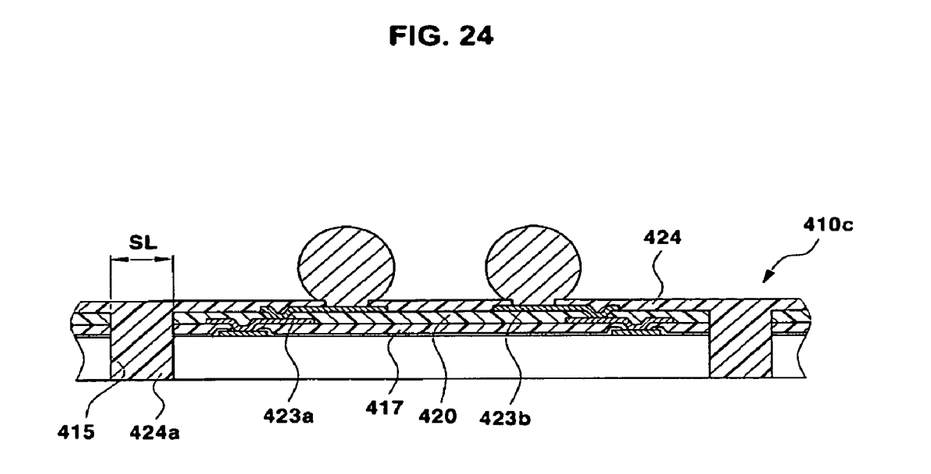
FIG. 24 is a cross-sectional view of the structure of an IC chip set of a wafer level semiconductor module in accordance with another example, non-limiting embodiment.
Figure 25:
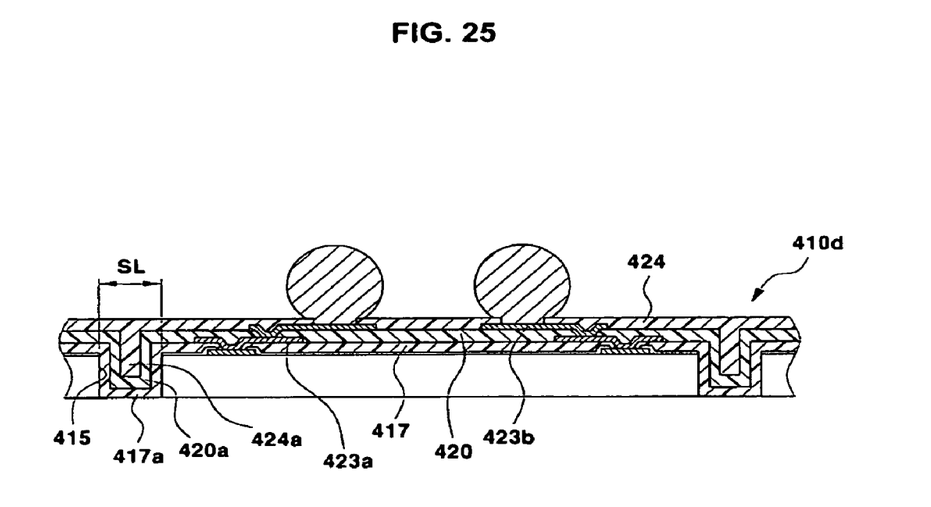
FIG. 25 is a cross-sectional view of the structure of an IC chip set of a wafer level semiconductor module in accordance with another, non-limiting example embodiment.

FIG. 22 is a cross-sectional view illustrating the structure of an IC chip set 410a of a wafer level semiconductor module in accordance with another example embodiment. FIG. 23 is a cross-sectional view of the structure of an IC chip set 410b of a wafer level semiconductor module in accordance with another example embodiment. FIG. 24 is a cross-sectional view of the structure of an IC chip set 410c of a wafer level semiconductor module in accordance with another example embodiment. FIG. 25 is a cross-sectional view of the structure of an IC chip set 410d of a wafer level semiconductor module in accordance with another example embodiment.

Referring to FIG. 22, in the structure of the IC chip set 410a, sealing portions 418 may be unconnected to an interlayer dielectric layer 417. Before the interlayer dielectric layer 417 is provided, polymer may be filled in trenches 415 to form the sealing portions 418. By way of example only, the sealing portions 418 may be formed from materials different from the interlayer dielectric layer 417, such as an elastomer composition.

Referring to FIG. 23, in the structure of the IC chip set 410b, sealing portions may be formed of a multilayered dielectric structure. An interlayer dielectric layer 417a and an insulating layer 424a may be provided in trenches 415 to form the sealing portions. For example, the interlayer dielectric layer 417a and the insulating layer 424a may each be filled in the trenches 415 at a predetermined thickness.

Referring to FIG. 24, in the structure of the IC chip set 410c, a multilayered, for example two-layered, redistribution layer 423a and 423b may be formed with interlayer dielectric layers 417 and 420. While an insulating layer 424 is being formed, the insulating layer 424 may be filled in trenches 415 to form sealing portions 424a.

Referring to FIG. 25, in the structure of the IC chip set 410d, interlayer dielectric layers 417a and 420a and an insulating layer 424a may be provided in trenches 415 to form multilayered sealing portions. For example, the interlayer dielectric layers 417a and 420a and the insulating layer 424a may each be filled in the trench 415 at a predetermined or desired thickness.

Figure 26:
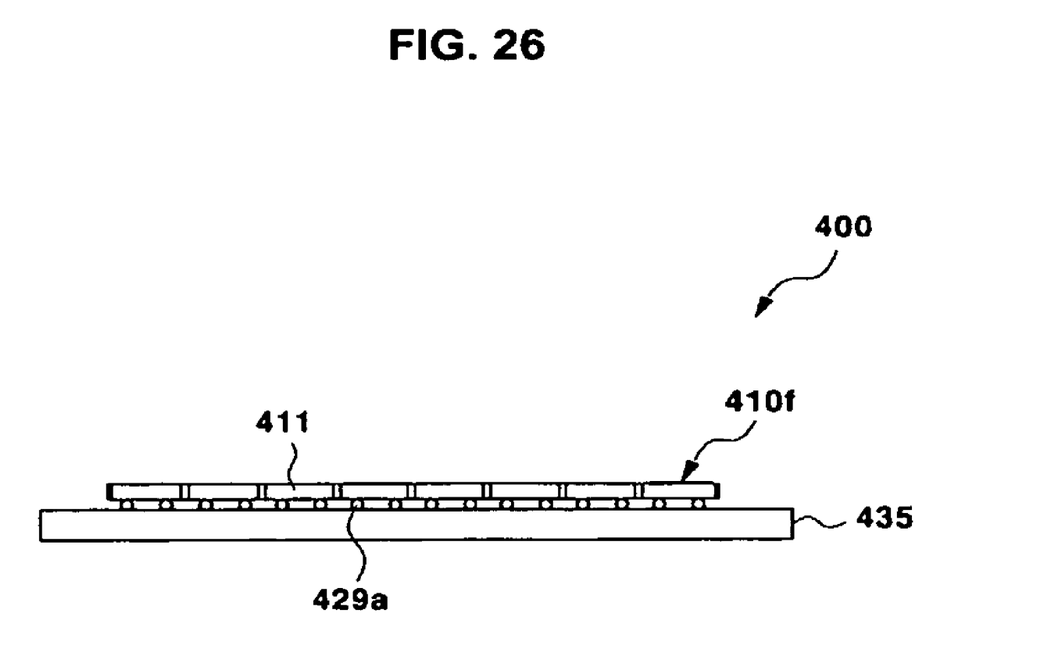
FIG. 26 is a cross-sectional view of a wafer level semiconductor module in accordance with another example, non-limiting embodiment.

FIG. 26 is a cross-sectional view of a wafer level semiconductor module 400 in accordance with another example embodiment.

Referring to FIG. 26, the wafer level semiconductor module 400 may include a module board 435 and an IC chip set 410f mounted on the module board 435 using external connection terminals 429a. External connection terminals 429a, for example the conductive bumps, may be uniformly arranged over the back surface of the IC chip set 410f. The arrangement of the external connection terminals may be made with regard to a chip or an IC chip set. The arrangement of the external connection terminals may (for example) reduce electrical connection routes of a semiconductor module.

In accordance with example, non-limiting embodiments, a wafer level semiconductor module in which an IC chip set may be mounted on a module board may reduce the size and/or increase capacity of the module board. Further, sealing portions provided in scribe line areas may absorb thermal stresses to reduce warpage of an IC chip set and/or prevent electrical interference between IC chips, which may improve the electrical and thermal characteristics of a semiconductor module.

Although example, non-limiting embodiments have been described in detail hereinabove, it should be understood that many variations and/or modifications of the basic inventive concepts taught herein, which may appear to those skilled in the art, will still fall within the spirit and scope as defined by the appended claims.

What is claimed is:

1. A wafer level semiconductor module, comprising:
a module board; and
an IC chip set mounted on the module board, the IC chip set including:
a plurality of IC chips having scribe line areas between adjacent IC chips,
each IC chip having a semiconductor substrate with an active surface with a plurality of chip pads and a back surface,
a passivation layer provided on the active surface of the semiconductor substrate of each IC chip having openings through which the chip pads are exposed, and
sealing portions provided in the scribe line areas,
wherein the sealing portions are formed from at least one elastomer composition.

2. The module of claim 1, wherein the sealing portions have a width substantially equal to a width of the corresponding scribe line areas.

3. The module of claim 1, wherein each IC chip has an interlayer dielectric layer provided on the active surface of the semiconductor substrate, a redistribution layer provided on the interlayer dielectric layer, and an insulating layer provided on the redistribution layer.

4. The module of claim 3, wherein the sealing portions are integral with the interlayer dielectric layer.

5. The module of claim 3, wherein the sealing portions are integral with the insulating layer.

6. The module of claim 3, further comprising external connection terminals provided on the redistribution layer and configured to connect the IC chip set to the module board.

7. The module of claim 6, wherein the external connection terminals are arranged at uniform intervals.

8. The module of claim 1, wherein the sealing portions are formed in a multilayered structure.

9. The module of claim 1, wherein the sealing portions are formed from polymer composition.

10. The module of claim 9, wherein the polymer composition includes lower-temperature-cured polymer.

11. The module of claim 1, wherein the back surface of each IC chip has a protection layer.

12. The module of claim 11, wherein the protection layer is an adhesive tape.

13. The module of claim 1, wherein the plurality of IC chips provided are in a matrix arrangement.

14. The module of claim 1, wherein the sealing portions are completely provided in the scribe line areas.

15. A wafer level semiconductor module, comprising:
a module board; and
an IC chip set mounted on the module board, the IC chip set including:
a plurality of IC chips having scribe line areas between adjacent IC chips,
each IC chip having a semiconductor substrate with an active surface with a plurality of chip pads and a back surface,
a passivation layer provided on the active surface of the semiconductor substrate of each IC chip having openings through which the chip pads are exposed, and
sealing portions provided in the scribe line areas,
wherein the back surface of each IC chip has a protection layer, the protection layer is an adhesive tape.

* * * * *